United States Patent
Hoekstra et al.

(10) Patent No.: US 9,772,901 B2
(45) Date of Patent: Sep. 26, 2017

(54) MEMORY RELIABILITY USING ERROR-CORRECTING CODE

(71) Applicant: FREESCALE SEMICONDUCTOR, INC., Austin, TX (US)

(72) Inventors: George P. Hoekstra, Austin, TX (US); Ravindraraj Ramaraju, Round Rock, TX (US)

(73) Assignee: NXP USA, INC., Austin, TX (US)

( * ) Notice: Subject to any disclaimer, the term of this patent is extended or adjusted under 35 U.S.C. 154(b) by 244 days.

(21) Appl. No.: 14/707,471

(22) Filed: May 8, 2015

(65) Prior Publication Data
US 2016/0328286 A1    Nov. 10, 2016

(51) Int. Cl.
| | |
|---|---|
| *G06F 11/10* | (2006.01) |
| *G11C 16/34* | (2006.01) |
| *G11C 11/56* | (2006.01) |
| *G11C 29/52* | (2006.01) |
| *G06F 3/06* | (2006.01) |
| *G06F 11/07* | (2006.01) |
| *G11C 29/42* | (2006.01) |

(52) U.S. Cl.
CPC ........ *G06F 11/1068* (2013.01); *G06F 3/0619* (2013.01); *G06F 3/0679* (2013.01); *G06F 11/0766* (2013.01); *G11C 11/56* (2013.01); *G11C 16/3418* (2013.01); *G11C 29/42* (2013.01); *G11C 29/52* (2013.01)

(58) Field of Classification Search
CPC ............. G06F 11/1068; G06F 11/0766; G06F 3/0619; G06F 3/0679; G11C 29/52; G11C 29/56; G11C 16/3418; G11C 29/42

USPC ................ 714/764, 773, 758, 799, E11.034; 365/200, 201, 185.09
See application file for complete search history.

(56) References Cited

U.S. PATENT DOCUMENTS

| | | | |
|---|---|---|---|
| 6,166,959 A | 12/2000 | Gupta et al. | |
| 7,093,190 B1* | 8/2006 | Kuslak ................ | G06F 11/1032 714/48 |
| 8,266,498 B2 | 9/2012 | Moyer | |
| 8,456,938 B2 | 6/2013 | Byom et al. | |
| 8,612,830 B2* | 12/2013 | Kitahara ............ | G11C 16/3418 711/103 |
| 8,707,135 B2 | 4/2014 | Tu et al. | |
| 8,756,474 B2* | 6/2014 | Shibata .............. | G11C 16/3431 365/222 |
| 9,176,800 B2* | 11/2015 | Blodgett ............... | G06F 11/106 |

(Continued)

OTHER PUBLICATIONS

Song et al, "A Logic-Compatible Embedded Flash Memory for Zero-Standby Power System-on-Chips Featuring a Multi-Story High Voltage Switch and a Selective Refresh Scheme", IEEE Journal of Solid-State Circuits, May 2013, pp. 1302-1314, vol. 48, Issue 5.

(Continued)

*Primary Examiner* — John J Tabone, Jr.

(57) ABSTRACT

A method and system are provided for error correction in a memory. Error correction code (ECC) for data stored in a portion of the memory is enabled. A location and number of errors for the portion of the memory is then stored. It is determined if the number of errors exceeds a predetermined number of errors. If the number of errors exceeds the predetermined number, then the data stored in the portion of the memory is refreshed. If refreshing does not correct the errors, then a different ECC may be used.

20 Claims, 6 Drawing Sheets

(56) References Cited

U.S. PATENT DOCUMENTS

| | | | | |
|---|---|---|---|---|
| 9,425,829 B2* | 8/2016 | Ramaraju | ............ | H03M 13/353 |
| 9,477,548 B2* | 10/2016 | Hoekstra | ............. | G06F 11/1064 |
| 2003/0043647 A1* | 3/2003 | Kanamori | ............ | G06F 11/1068 |
| | | | | 365/200 |
| 2005/0120265 A1* | 6/2005 | Pline | ................... | G06F 11/1008 |
| | | | | 714/6.32 |
| 2008/0072116 A1* | 3/2008 | Brittain | ................ | G06F 11/073 |
| | | | | 714/758 |
| 2008/0279005 A1* | 11/2008 | France | ................ | G06F 12/0246 |
| | | | | 365/185.11 |
| 2008/0316822 A1* | 12/2008 | Ahn | .................... | G06F 11/1068 |
| | | | | 365/185.09 |
| 2009/0132875 A1* | 5/2009 | Kitahara | ............. | G06F 11/1068 |
| | | | | 714/721 |
| 2009/0161466 A1* | 6/2009 | Hamilton | ............... | G11C 16/10 |
| | | | | 365/222 |
| 2009/0310408 A1* | 12/2009 | Lee | ..................... | G11C 11/5628 |
| | | | | 365/185.03 |
| 2010/0251075 A1* | 9/2010 | Takahashi | ........... | G06F 11/1068 |
| | | | | 714/773 |
| 2011/0119431 A1* | 5/2011 | Chowdhury | ....... | G11C 16/3418 |
| | | | | 711/103 |
| 2012/0246525 A1* | 9/2012 | Shibata | .............. | G11C 16/3431 |
| | | | | 714/704 |
| 2013/0055046 A1* | 2/2013 | Blodgett | ............... | G06F 11/106 |
| | | | | 714/764 |
| 2013/0318418 A1* | 11/2013 | Bedeschi | ............ | G06F 11/1048 |
| | | | | 714/758 |
| 2014/0115419 A1* | 4/2014 | Ahn | .................... | G06F 11/1048 |
| | | | | 714/758 |
| 2015/0380111 A1* | 12/2015 | Rao Subbu | ........ | G11C 29/52 |
| | | | | 714/763 |
| 2016/0011930 A1* | 1/2016 | Yeh | ..................... | G06F 11/0793 |
| | | | | 714/15 |
| 2016/0019974 A1* | 1/2016 | Blodgett | ............... | G06F 11/106 |
| | | | | 365/185.03 |
| 2016/0162357 A1* | 6/2016 | Desireddi | ........... | G06F 11/1068 |
| | | | | 714/764 |
| 2016/0224412 A1* | 8/2016 | Healy | ................. | G06F 11/1008 |

OTHER PUBLICATIONS

Cai et al, "Flash Correct-and-Refresh: Retention-Aware Error Management for Increased Flash Memory Lifetime", 30th International Conference on Computer Design (ICCD), Sep. 30-Oct. 3, 2012, pp. 94-101, IEEE.

U.S. Appl. No. 14/450,168, Hoekstra, "Error Repair Location Cache", filed Aug. 1, 2014.

U.S. Appl. No. 14/266,202, Hoekstra, "Error Correction with Secondary Memory", filed Apr. 30, 2014.

U.S. Appl. No. 14/485,624, Ramaraju, "Adaptive Error Correction Codes (ECCs) for Electronic Memories", filed Sep. 12, 2014.

* cited by examiner

MEMORY RELIABILITY USING ERROR-CORRECTING CODE

BACKGROUND

Field

This disclosure relates generally to memories, and more specifically, to data retention in memories.

Related Art

With the advancement of semiconductor process technology, memory geometries become increasing smaller. Smaller memory geometries allow for development of higher capacity memories with higher densities. Data retention concerns increase with these higher capacity memories. Data retention can affect overall memory quality in areas such as yield and reliability. To address yield and reliability concerns in these higher capacity memories, error correction techniques can be employed.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Large capacity memory systems may employ error correction techniques to improve the yield and reliability of the memory bits in a memory. One technique for error correction includes the use of Error Correction Code (ECC), which uses addition memory bits to represent an attribute of a memory word that the additional bits are associated with. For example, the additional bits could represent the parity of a word or even replicate the entire word itself. A variety of ECC methodologies exist to strike a balance between the physical overhead associated with additional memory bits, the impact on READ latency required to evaluate whether a memory word has a failure and the efficacy of the ECC to correct the memory word it is associated with.

ECC can be effective in correcting detected bit errors that occur in a memory. An inherent number of failed bits may exist in a memory, some or all of which can be corrected by executing the ECC. The term "inherent number of failed bits" means the number of failed bits determined when reading the memory prior to executing ECC. Failed bits can result from manufacturing defects, soft errors, or normal wear and tear, for example. In some embodiments, the inherent number of failed bits can be zero. Cataloging bit location fails and their state can be useful to refresh, move, expand ECC, or otherwise repair or correct the failed bits.

Figure 1:
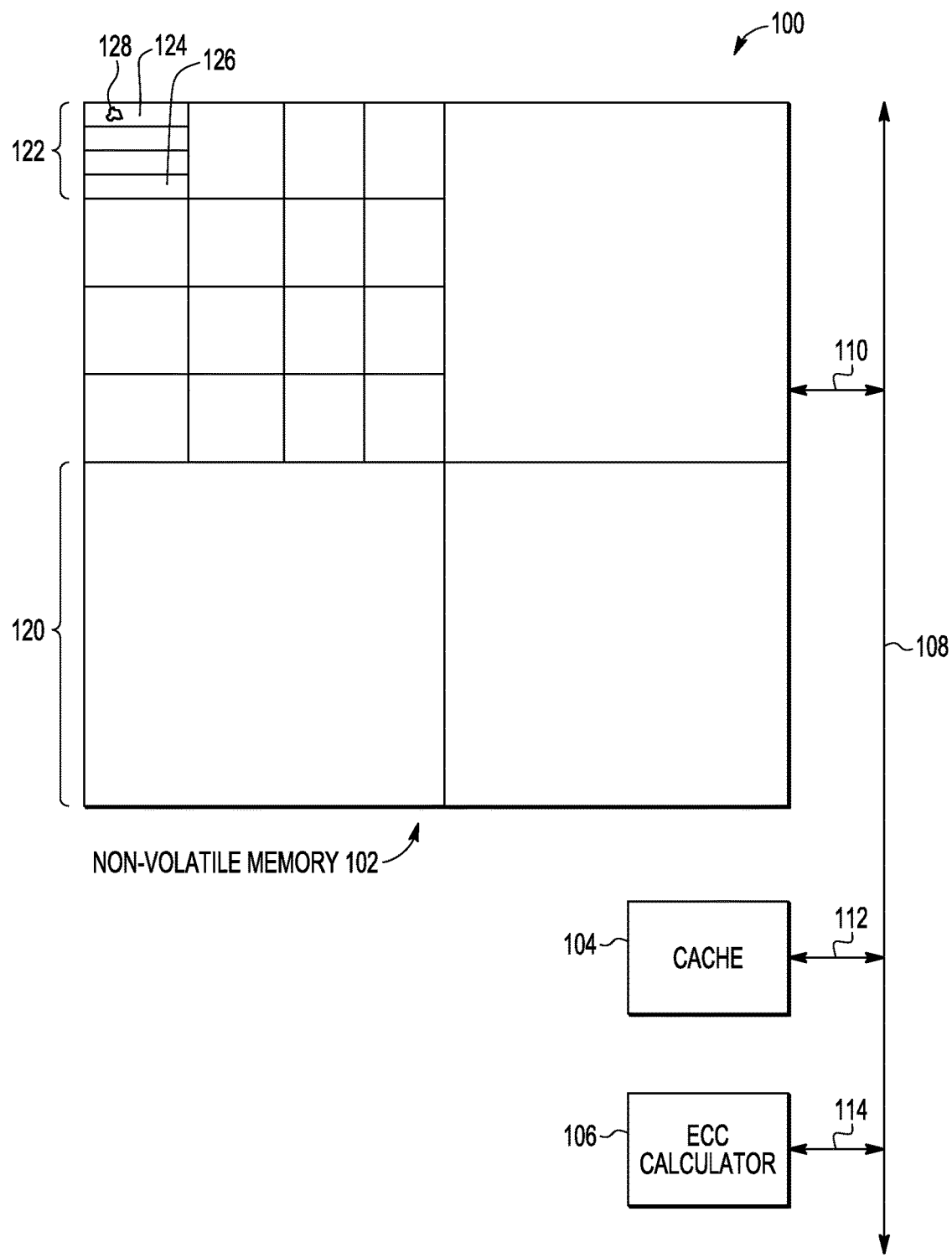
FIG. 1 is a block diagram which illustrates a system for correcting errors in a non-volatile memory.

FIG. 1 illustrates a system 100 for correcting errors in a non-volatile memory in accordance with an embodiment of the present disclosure. The system may include a non-volatile memory 102, a cache memory 104, and an ECC calculator block 106. In some embodiments, the non-volatile memory may be a NAND Flash memory, however other large capacity memories may be envisioned with the scope of this disclosure, whether volatile or non-volatile. In some embodiments, the non-volatile memory may be a multi-level cell (MLC) Flash memory. In some embodiments, the non-volatile memory may be an MRAM memory or a PRAM memory or other memory type that may experience non-random errors. In some embodiments, the cache 104 can be a 2-way set associate cache. In some embodiments, the cache can be a fully associative, 4-way cache or other multi-way cache. In some embodiments, the ECC calculator 106 can be implemented with a combination of logic gates. In some embodiments, the ECC calculator 106 can be a processor that may share processing for other peripherals. The non-volatile memory 102 can be coupled to a bus 108 and may communicate with the bus 108 through a connection 110. The cache 104 can be coupled to the bus 108 and may communicate with the bus 108 through a connection 112. The ECC calculator 106 can be coupled to the bus 108 and may communicate with the bus 108 through a connection 114.

The non-volatile memory 102 may include a plurality of blocks 120 defining a group of memory bits that can be concurrently erasable through a shared connection. In some embodiments, the shared connection may be a semiconductor substrate (e.g. "bulk") connection. Each block 120 can be partitioned into a plurality of pages 122. Each page 122 may have a plurality of memory words 124 that share a group of ECC bits 126 that encode at least a portion of the information contained within the page. In some embodiments, a defect 128 may affect a memory word 124 and thereby can result in a non-random failure of memory bits that may be correctable by the concepts disclosed herein.

The ECC calculator 106 may be used for executing ECC to detect and correct errors on data stored in the non-volatile memory 102. The number of errors detected by the ECC and the locations of the errors may be stored in the cache memory 104. A program/erase block (not shown) can be used for performing a refresh operation of a stored location of the non-volatile memory 102 in response to the number of errors exceeding a predetermined limit. In some embodiments, the refresh operation may be an erase operation of the stored location followed by a program operation of the stored location of the non-volatile memory 102.

If the refresh operation did not correct the errors detected by the ECC, a different ECC scheme may be used by the ECC calculator 106 for executing ECC on data stored in the non-volatile memory 102. For example, the ECC may have been enabled to correct single bit errors. When the ECC capability is expanded, the ECC can be used to correct multi-bit errors, such as two-bit errors. If after the expanded ECC is executed and the number of errors exceeds a predetermined limit, then the data can be marked as uncorrectable and stored in a different location in the non-volatile memory 102.

Figure 2:
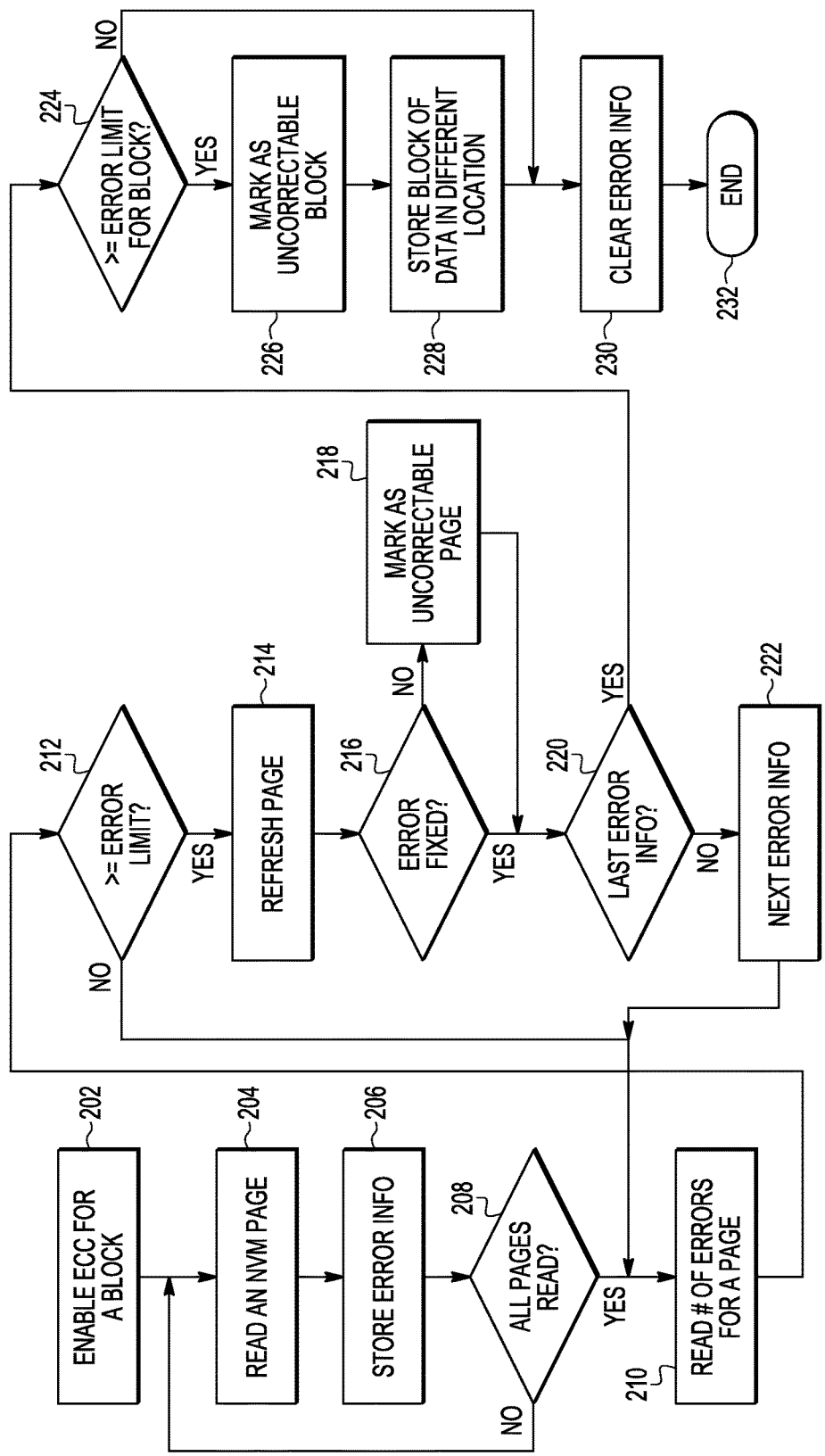
FIG. 2 is a flow chart which illustrates a refresh method of correcting errors in a memory in accordance with an embodiment of the present disclosure.

FIG. 2 is a flow chart 200 illustrating a method of correcting errors in a non-volatile memory in accordance with an embodiment of the present disclosure. In this embodiment, error information about ECC detected errors can be stored and used to repair or correct memory errors. The information may include location and number of the errors detected by the ECC. When the error information indicates that an error limit has been reached, a refresh can be performed.

At step 202, an ECC can be enabled for data stored in a block portion of the non-volatile memory. The block of non-volatile memory may include one or more pages. Each page may include a row of consecutive bits in the memory block. In some embodiments, the ECC can use a Hamming code algorithm. In some embodiments, the ECC can use a Reed-Solomon code algorithm. In some embodiments, the ECC can use a BCH code algorithm.

At step 204, a page of the non-volatile memory block can be read. When the page of non-volatile memory is read, errors may be detected and corrected by the ECC.

At step 206, information about errors detected by the ECC can be stored in a memory. In some embodiments, the error information may be stored in a cache memory. In some embodiments, the error information may be stored in a multi-way cache memory. In some embodiments, the error information may be stored in non-volatile memory locations for maintaining a history of error information through power cycles. The error information stored about the errors may include number of errors, bit location of each error, its state, and any other information which may be used to manage and correct a failed bit.

At step 208, determine whether all pages in the block of non-volatile memory have been read. If all the pages have been read (yes), then at step 210, the number of errors detected by the ECC for a page in the block of non-volatile memory can be read. If all the pages have not been read (no), then return at step 204.

At step 212, determine whether the number of errors for a page is equal to or greater than a predetermined error limit. If the number of errors is equal to or greater than the error limit for a page (yes), then at step 214, the page can be refreshed. If the error limit is not reached (no), then return at step 210.

At step 214, the page having the number of errors equal to or greater than the error limit can be refreshed. A page refresh can include rewriting data at each location in the page. The page refresh can correct one or more of the errors detected in the page. In some embodiments, a page refresh can include erasing the page before re-programming data in the page.

At step 216, determine whether the page refresh can correct the errors detected in the page. If the errors were corrected (yes), then determine if the last error information has been read at step 220. If the errors were not corrected (no), then at step 218, the page can be marked as an uncorrectable page, and continue at step 220.

At step 220, determine whether the last error information has been read. If the last error information was not read (no), then at step 222 read next error information and return at step 210. If the last error information was read (yes), then continue at step 224.

At step 224, determine whether the number of errors detected by the ECC for the block is equal to or greater than a predetermined block error limit. If the number of errors is equal to or greater than the block error limit for a block (yes), then continue at step 226. If the block error limit is not reached (no), then at step 230 error information can be cleared.

At step 226, if the number of errors for the block limit has been reached, then the block can be marked as an uncorrectable block.

At step 228, when the block is marked as an uncorrectable block, then the block of data may be stored in a different memory location.

At step 230, error information may be cleared, and at step 232, the error correction flow can terminate.

Figure 3:
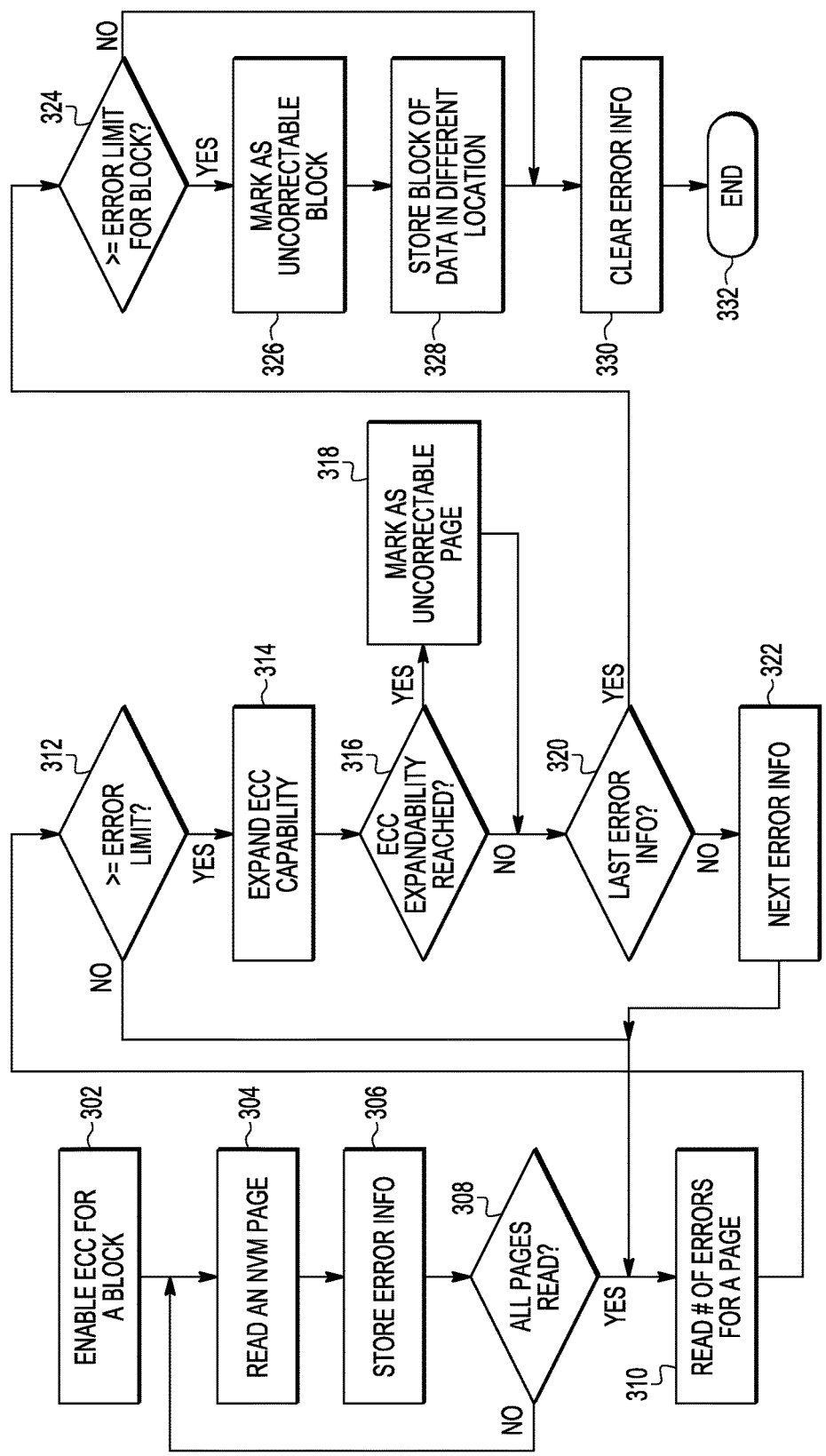
FIG. 3 is a flow chart which illustrates an expanding ECC method of correcting errors in a memory in accordance with an embodiment of the present disclosure.

FIG. 3 is a flow chart 300 illustrating a method of correcting errors in a non-volatile memory in accordance with an embodiment of the present disclosure. In this embodiment, error information about errors detected by the ECC can be stored and used to correct memory errors. The error information may include location and number of errors. When the error information indicates that an error limit has been reached, the ECC capability can be expanded.

At step 302, an ECC can be enabled for a block portion of non-volatile memory. The block of non-volatile memory may include one or more pages. Each page may include a row of consecutive bits in the memory block. In some embodiments, the ECC can be used to correct single bit errors. In some embodiments, the ECC can be used to correct multiple bit errors. In some embodiments, the ECC can use a Hamming code algorithm. In some embodiments, the ECC can use a Reed-Solomon code algorithm. In some embodiments, the ECC can use a BCH code algorithm.

At step 304, a page of the non-volatile memory block can be read. When the page of non-volatile memory is read, errors may be detected and corrected by the ECC.

At step 306, information about the errors detected by the ECC can be stored in a memory. In some embodiments, the error information may be stored in a cache memory. In some embodiments, the error information may be stored in non-volatile memory locations for maintaining a history of error information through power cycles. The error information stored about the errors may include number of errors, bit location of each error, its state, and any other information which may be used to manage and correct one or more failed bits.

At step 308, determine whether all pages in the block of non-volatile memory have been read. If all the pages have been read (yes), then at step 310, the number of errors detected by the ECC for a page can be read. If all the pages have not been read (no), then return to step 304.

At step 310, the number of errors for a page in the block of non-volatile memory can be read.

At step 312, determine whether the number of errors for a page is equal to or greater than a predetermined error limit. If the number of errors is equal to or greater than the error limit for a page (yes), then at step 314, a different ECC can be enabled. If the error limit is not reached (no), then return at step 310.

At step 314, a different ECC can be used. For example, the ECC capability can be expanded for the page having the number of errors equal to or greater than the error limit. For example, the ECC may be enabled at step 302 to correct single bit errors. With the ECC capability correcting single bit errors, the ECC might not correct all of the errors. Expanding the ECC capability allows more errors to be corrected. For example, when the ECC capability is expanded, the ECC can be used to correct multi-bit errors such as two-bit errors.

At step 316, determine whether ECC expandability limit has been reached for the page. The ECC expandability limit can be the number of correctable bit errors by which the ECC capability can be expanded. For example, the ECC expandability may be limited to correct up to two-bit errors in a page. If the ECC expandability limit has not been reached (no), then determine if the last error information has been read at step 320. If the ECC expandability limit has been reached (yes), then the expanded ECC did not correct the errors in the data and the page can be marked as an uncorrectable page at step 318.

At step 320, determine whether the last error information has been read. If the last error information was not read (no), then at step 322 read next error information and return at step 310. If the last error information was read (yes), then continue at step 324.

At step 324, determine whether the number of errors detected by the ECC for the block is equal to or greater than a predetermined block error limit. If the number of errors is equal to or greater than the block error limit for a block (yes), then continue at step 326. If the block error limit is not reached (no), then at step 330 error information can be cleared.

At step 326, if the number of errors for the block error limit has been reached, then the block can be marked as an uncorrectable block.

At step 328, when the block is marked as an uncorrectable block, then the block of data may be stored in a different memory location.

At step 330, error information may be cleared, and at step 332, the error correction flow can terminate.

Figure 4:
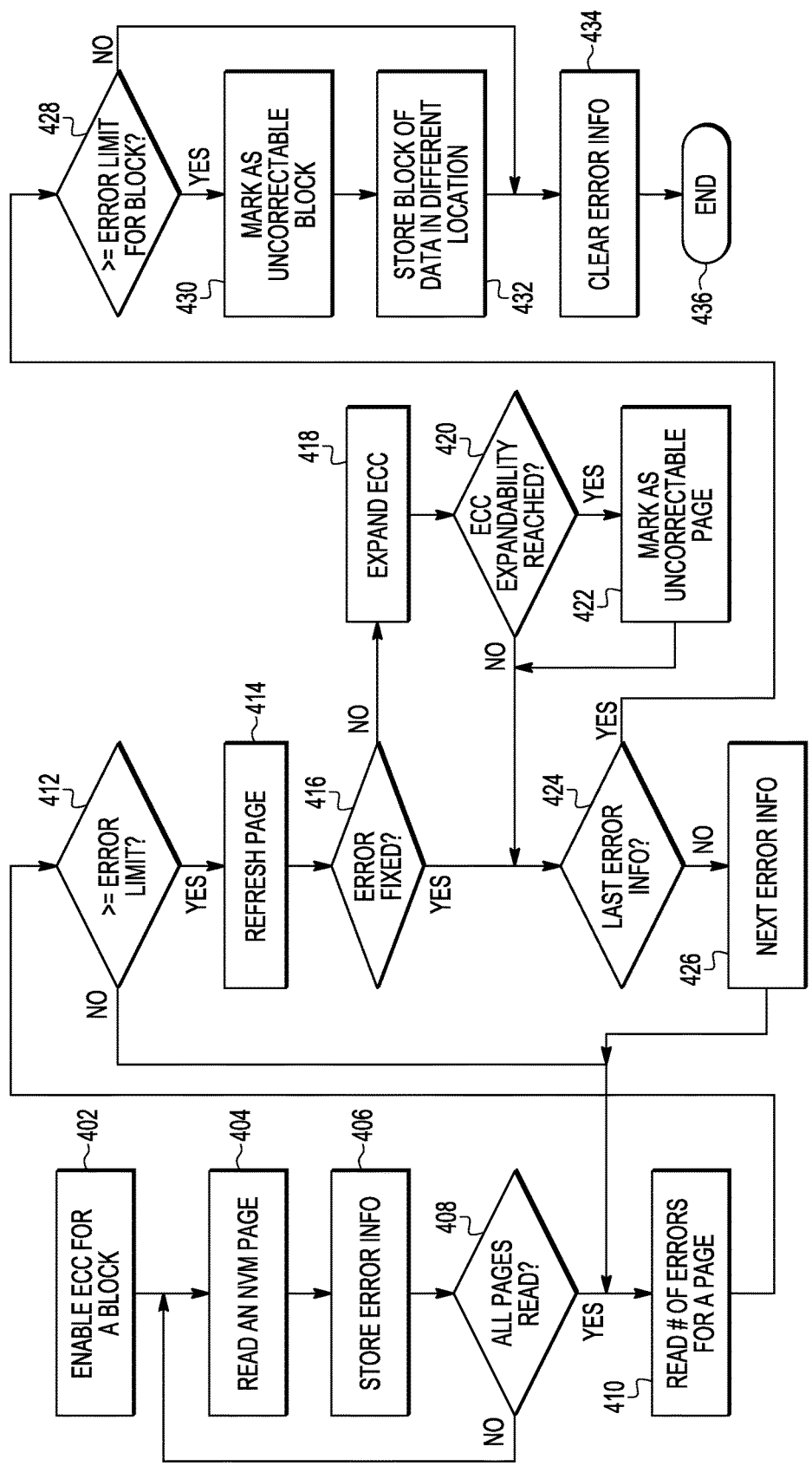
FIG. 4 is a flow chart which illustrates a refresh with expanding ECC method of correcting errors in a memory in accordance with an embodiment of the present disclosure.

FIG. 4 is a flow chart 400 illustrating a method of correcting errors in a non-volatile memory in accordance with an embodiment of the present disclosure. In this embodiment, error information about errors detected by the ECC can be stored and used to correct memory errors. The information may include location and number of errors. When the error information indicates that an error limit has been reached, a refresh can be performed. If errors remain after the refresh, the ECC capability can be expanded.

At step 402, an ECC can be enabled for data stored in a block portion of the non-volatile memory. The block of non-volatile memory may include one or more pages. Each page may include a row of consecutive bits in the memory block. In some embodiments, the ECC can use a Hamming code algorithm. In some embodiments, the ECC can use a Reed-Solomon code algorithm. In some embodiments, the ECC can use a BCH code algorithm.

At step 404, a page of the non-volatile memory block can be read. When the page of non-volatile memory is read, errors may be detected and corrected by the ECC.

At step 406, information about errors detected by the ECC can be stored in a memory. In some embodiments, the error information may be stored in a cache memory. In some embodiments, the error information may be stored in non-volatile memory locations for maintaining a history of error information through power cycles. The error information stored about the errors detected may include number of errors, bit location of the each error, its state, and any other information which may be used to manage and repair or correct one or more failed bits.

At step 408, determine whether all pages in the block of non-volatile memory have been read. If all the pages have been read (yes), then at step 410, the number of errors for a page in the block of non-volatile memory can be read. If all the pages have not been read (no), then return at step 404.

At step 412, determine whether the number of errors detected by the ECC for a page is equal to or greater than a predetermined error limit. If the number of errors is equal to or greater than the error limit for a page (yes), then at step 414, the page can be refreshed. If the error limit is not reached (no), then return at step 410.

At step 414, the page having the number of errors equal to or greater than the error limit can be refreshed. A page refresh can include rewriting data at each location in the page. The page refresh can correct one or more of the errors detected in the page. In some embodiments, a page refresh can include erasing the page before re-programming data in the page.

At step 416, determine whether the page refresh can correct the errors detected in the page. If the errors were corrected (yes), then determine if the last error information has been read at step 420. If the errors were not corrected (no), then at step 418, a different ECC capability can be enabled for the page.

At step 418, after determining that errors may not be corrected by a page refresh, a different ECC can be used. For example, the ECC capability can be expanded for the page. The ECC may be enabled at step 402 to correct single bit errors. When the ECC is enabled to correct single bit errors, the ECC may not correct all of the errors. Expanding the ECC capability allows more errors to be corrected. When the ECC capability is expanded, the ECC can be used to correct multi-bit errors, such as two-bit errors for example.

At step 420, determine whether ECC expandability limit has been reached for the page. The ECC expandability limit can be the number of correctable bit errors by which the ECC capability can be expanded. For example, the ECC expandability may be limited to correct up to two-bit errors in a page. If the ECC expandability limit has not been reached (no), then determine if the last error information has been read at step 424. If the ECC expandability limit has been reached (yes), then the expanded ECC did not correct the errors in the data and the page can be marked as an uncorrectable page at step 422.

At step 424, determine whether the last error information has been read. If the last error information was not read (no), then at step 426 read the next error information and return at step 410. If the last error information was read (yes), then continue at step 428.

At step 428, determine whether the number of errors detected by the ECC for the block is equal to or greater than a predetermined block error limit. If the number of corrected errors is equal to or greater than the block error limit for a block (yes), then continue at step 430. If the block error limit is not reached (no), then continue at step 434.

At step 430, if the number of errors for the block error limit has been reached, then the block can be marked as an uncorrectable block.

At step 432, when the block is marked as an uncorrectable block, then the block of data may be stored in a different memory location.

At step 434, error information may be cleared, and at step 436, the error correction flow can terminate.

Figure 5:
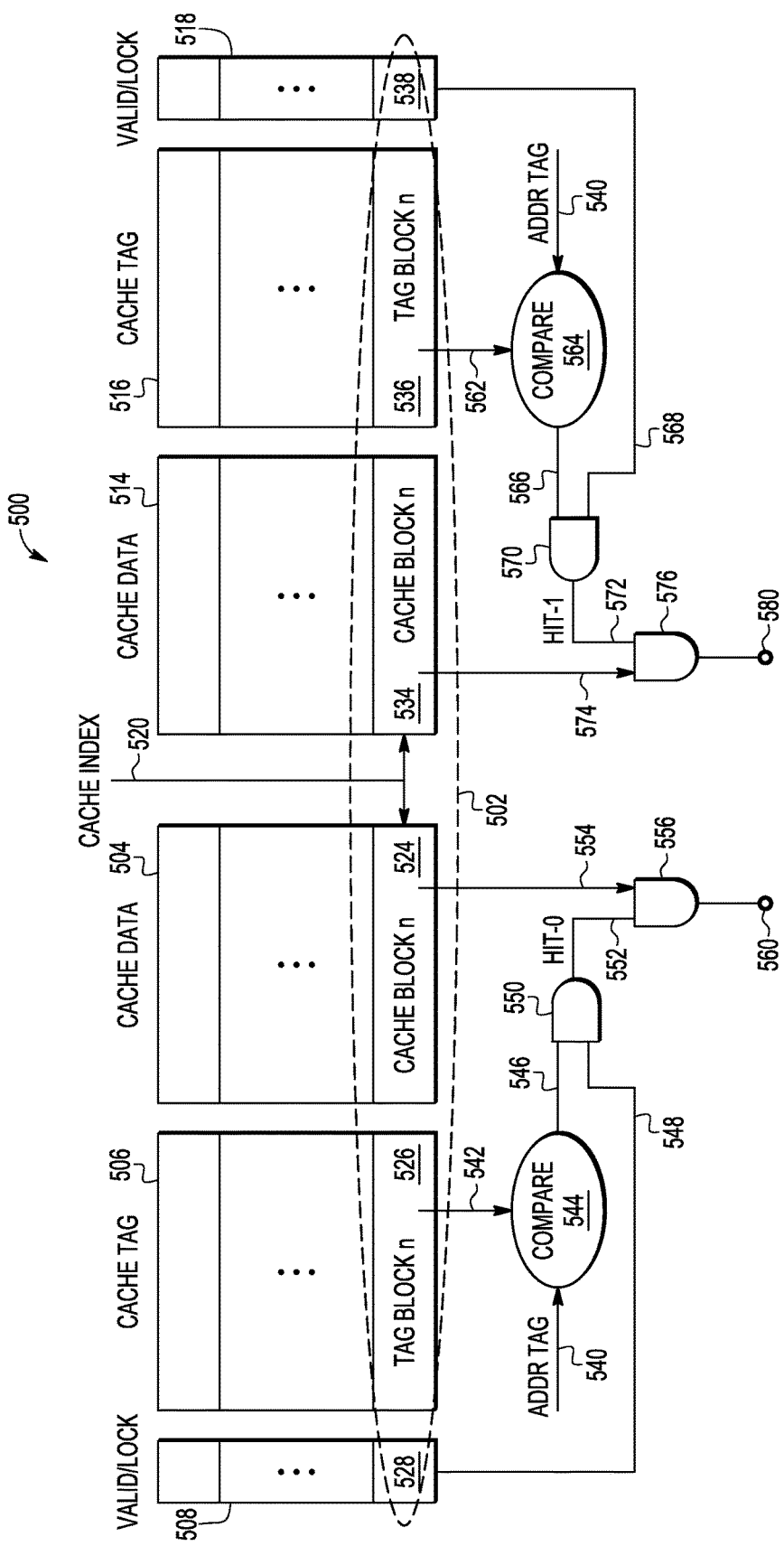
FIG. 5 is a schematic diagram which illustrates a cache used for correcting errors in a memory in accordance with an embodiment of the present disclosure.

FIG. 5 shows a 2-way set associative cache 500 according to an embodiment of the present disclosure. The cache 500 includes at least one Cache Set 502 including two "ways." One way of a set includes one entry from a Cache Data 504, a respective entry from a Cache Tag 506 and respective pair of Valid/Lock bits 508. A second way of the set includes one entry from a Cache Data 514, a respective entry from a Cache Tag 516 and respective pair of Valid/Lock bits 518. A Cache Index 520 selects one of the sets corresponding to one of the blocks 120 from FIG. 1. The Cache Data 504 and 514 each hold data related to a respective failed bit, including but not limited to failure location and failure state. The Cache Tag 506 and 516 hold a corresponding page address (e.g. Page 122 from FIG. 1) within which the failed bit resides. The pair of Valid/Lock bits 508 and 518 are used to indicate whether the data in the Cache Data 504 and 514 are valid, and whether they are locked as a result of the data successfully correcting a saturated ECC condition.

In one example of the operation of the 2-way set associative cache 500, the Cache Index 520 selects a Cache Set 502 corresponding to Block n (where "n" is one of the blocks from the Memory 102 of FIG. 1). The Cache Set 502 includes a Cache Block n 524, a Tag Block n 526 and a pair of Valid/Lock bits 528 for one way, and a Cache Block n 534, a Tag Block n 536 and a pair of Valid/Lock bits 538 for the second way. An address tag (Addr Tag) 540 is compared with the output 542 of Tag block n 526 with a comparator 544. If both the comparator output 546 and a corresponding valid bit 548 from the Valid/Lock bit pair 508 are true (e.g. both have a logical "1" state or high state) then an AND-gate 550 provides a Hit-0 552 being true. If Hit-0 552 is true, then the data 554 from the Cache Block n 524 is combined with an AND-gate 556 to produce a first way output 560.

Similarly, an address tag (Addr Tag) 540 is compared with the output 562 of Tag block n 536 with a comparator 564. If both the comparator output 566 and a corresponding valid bit 568 from the Valid/Lock bit pair 518 are true (e.g. both have a logical "1" state or high state) then an AND-gate 570 provides a Hit-1 572 being true. If Hit-0 572 is true, then the data 574 from the Cache Block n 534 is combined with an AND-gate 576 to produce a second way output 580. The first way output 560 and the second way output 580 provide data related to two failed bits within a page 122 (FIG. 1) that are used to extend the capability of the ECC bits 126 (FIG. 1).

Figure 6:
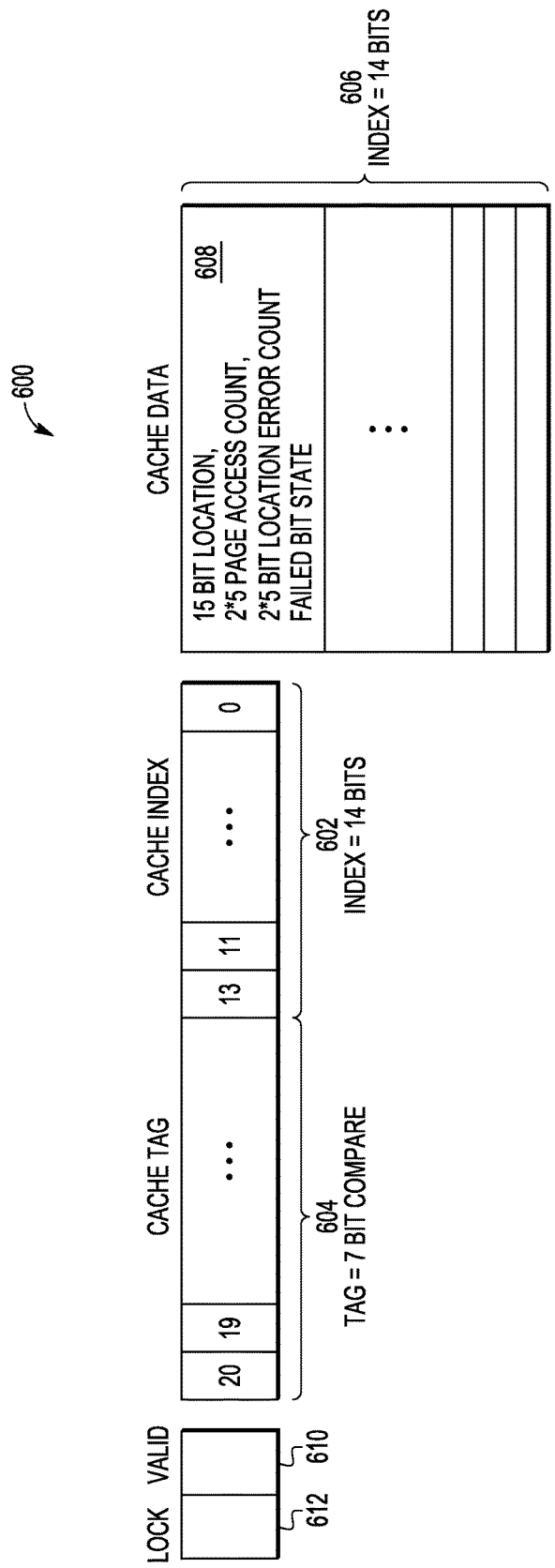
FIG. 6 is a block diagram which illustrates an addressing scheme for one way of a cache set in accordance with an embodiment of the present disclosure.

FIG. 6 shows an addressing scheme 600 for one way of the cache set 500. The scheme 600 may include Cache Index 602, a Cache Tag 604, a Cache Data 606 with a region 608 corresponding to one set, a Valid bit 610 and a Lock bit 612. An example embodiment includes 16K Blocks, each Block being similar to Block 120 from FIG. 1 and addressed by 14 bits. Each Block 120 has 538 Pages 122 (from FIG. 1) addressed by 7 bits. Each Page 122 includes 4K bytes addressed by 12 bits. Each byte is addressed by 3 bits. With reference to FIG. 6, the Cache Index 602 may be used to select one of 16K blocks and thus has 14 bits. Similarly, one region 608 in the Cache Data 606 corresponding to one of 16K blocks, may require 14 bits to be uniquely addressed. The Cache Tag 604 includes bits 14 through 20 (e.g. 7 bits corresponding to 128 pages per block). The Valid bit 610 and the Lock bit 612 are each single bits. In one embodiment, each region 608 of the Cache Data 606 includes 15 bits to identify a failed bit location (e.g. 4K bytes/page addressed with 12 bits, and 3 bits/byte). The region 608 also includes 5 bits for the page access count, 5 bits for the location error count and a single bit for the failed bit state. It is envisioned within the scope of this disclosure that different block and page sizes are realizable as are different limits for the location, page access count and location error count.

Generally, there is provided, a method for error correction in a memory including: enabling error correction code (ECC) for data stored in a portion of the memory; storing a location and number of errors for the portion of the memory; determining that the number of errors exceeds a predetermined number of errors; and refreshing the portion of the memory. The method may further include: determining that the refreshing the portion of the memory did not correct the errors in the data; and storing the data in a different portion of the memory. Storing a location and number of errors may further include storing the location and number of errors in a cache memory. The cache may be a multi-way cache. The method may further include: determining that refreshing the portion of the memory did not correct the errors in the data; and enabling a different ECC for the portion of the memory. The method may further include: determining that enabling a different ECC did not correct the errors in the data; and storing the data in a different portion of the memory. The ECC may be for correcting one-bit errors, and the different ECC may be expanded to correct two-bit errors. The memory may be characterized as being a non-volatile memory.

In another embodiment, there is provided, a method for error correction in a memory including: enabling error correction code (ECC) for data stored in a portion of the memory; storing a location and number of errors detected by the ECC for the portion of the memory; determining that the number of errors exceeds a predetermined number; and enabling a different ECC for the portion of the memory. The method may further include: determining that enabling a different ECC did not correct the errors in the data; and storing the data in a different portion of the memory. The method may further include: determining that enabling a different ECC did not correct the errors in the data; and refreshing the portion of the memory. The method may further include: determining that refreshing the portion of the memory did not correct the errors in the data; and storing the data in a different portion of the memory. The ECC may be for correcting one-bit errors, and the different ECC may be expanded to correct two-bit errors. The memory may be characterized as being a multi-level cell (MLC) flash memory. Storing a location and number of errors may further include storing the location and number of errors in a cache memory.

In yet another embodiment, there is provided, a system including: a bus for communicating information; a non-volatile memory coupled to the bus; an error correction code (ECC) block coupled to the bus, the ECC block for executing ECC on information stored in the non-volatile memory; a system memory coupled to the bus, the system memory for storing a number of errors detected by the ECC, and for storing locations of the errors; and a program/erase block for the non-volatile memory, the program/erase block for performing a refresh operation of a stored location of the non-volatile memory in response to the number of errors exceeding a limit. The ECC block may further include executing a different ECC on the information stored in the non-volatile memory if the refresh operation did not correct the errors. The information may be stored in a different location of the non-volatile memory if after the different ECC is executed the number of errors exceeds the limit. The non-volatile memory may be characterized as being a multi-level cell (MLC) flash memory. The system memory may be characterized as being a multi-way associative cache.

By now it should be appreciated that there has been provided a method and system for cataloging bit location fails and their state to refresh, move, expand ECC, or otherwise repair or correct failed bits in a memory, thus improving the quality and reliability of the memory.

The semiconductor substrate described herein can be any semiconductor material or combinations of materials, such as gallium arsenide, silicon germanium, silicon-on-insulator (SOI), silicon, monocrystalline silicon, the like, and combinations of the above.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary memory system architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations may be merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for error correction in a memory, the method comprising:
   enabling error correction code (ECC) for data stored in a portion of the memory to determine a location and number of the errors within the portion of the memory, wherein the portion of the memory is part of a block of the memory;
   storing the location and the number of errors for the portion of the memory;
   determining that the number of errors in the portion of the memory exceeds a predetermined number of errors for the portion of the memory;
   refreshing the portion of the memory to correct errors in the portion of the memory in response to the number of errors in the portion of memory exceeding the predetermined number of errors for the portion of the memory;
   determining that a number of errors in the block of the memory exceeds a predetermined number of errors for the block of the memory in response to determining that the refreshing the portion of the memory did not correct the errors in the data; and
   storing the data in a different block of the memory in response to determining that the number of errors in the block of the memory exceeds the predetermined number of errors for the block of the memory.

2. The method of claim 1, further comprising:
   determining that the refreshing the portion of the memory did not correct the errors in the data; and
   marking the portion of the memory as uncorrectable in response to the refreshing the portion of the memo did not correct the errors in the data.

3. The method of claim 1, wherein storing a location and number of errors further comprises storing the location and number of errors in a cache memory.

4. The method of claim 3, wherein the cache is a multi-way cache.

5. The method of claim 1, further comprising:
determining that refreshing the portion of the memory did not correct the errors in the data; and
enabling a different ECC for the portion of the memory to correct the errors in the portion of the memory in response to the refreshing the portion of the memory did not correct the errors in the data.

6. The method of claim 5, further comprising:
determining that enabling a different ECC did not correct the errors in the data; and
storing the data in a different portion of the memory in response to determining that the different ECC did not correct the errors in the data.

7. The method of claim 5, wherein the ECC is for correcting one-bit errors, and wherein the different ECC is expanded to correct two-bit errors.

8. The method of claim 1, wherein the memory is characterized as being a non-volatile memory.

9. A method for error correction in a memory, the method comprising:
enabling error correction code (ECC) for data stored in a portion of the memory to determine a location and number of the errors within the portion of the memory, wherein the portion of the memory is part of a block of the memory;
storing the location and the number of errors detected by the ECC for the portion of the memory;
determining that the number of errors in the portion of the memory exceeds a predetermined number of errors for the portion of the memory;
enabling a different ECC for the portion of the memory to correct errors in the portion of the memo in response to the number of errors in the portion of the memory exceeding the predetermined number of errors for the portion of the memory;
determining that a number of errors in the block of the memory exceeds a predetermined number of errors for the block of the memory in response to determining that the different ECC did not correct the errors in the data; and
storing the data in a different block of the memory in response to determining that the number of errors in the block of the memory exceeds the predetermined number of errors for the block of the memory.

10. The method of claim 9, further comprising:
determining that enabling a different ECC did not correct the errors in the data; and
marking the portion of the memory as uncorrectable in response to determining that the different ECC did not correct the errors in the data.

11. The method of claim 9, further comprising:
determining that enabling a different ECC did not correct the errors in the data; and
refreshing the portion of the memory to correct the errors in the portion of the memory in response to determining that the different ECC did not correct the errors in the data.

12. The method of claim 11, further comprising:
refreshing the portion of the memory to correct errors in the portion of the memory in response to the number of errors exceeding the predetermined number of errors;
determining that refreshing the portion of the memory did not correct the errors in the data; and
marking the portion of the memory as uncorrectable in response to the refreshing the portion of the memory did not correct the errors in the data.

13. The method of claim 9, wherein the ECC is for correcting one-bit errors, and wherein the different ECC is expanded to correct two-bit errors.

14. The method of claim 9, wherein the memory is characterized as being a multi-level cell (MLC) flash memory.

15. The memory of claim 9, wherein storing a location and number of errors further comprises storing the location and number of errors in a cache memory.

16. A system, comprising:
a bus for communicating information;
a non-volatile memory coupled to the bus;
an error correction code (ECC) block coupled to the bus, the ECC block for executing ECC on the information stored in the non-volatile memory to determine a number of errors and locations of the errors in the non-volatile memory;
a system memory coupled to the bus, the system memory for storing the number of errors detected by the ECC, and for storing the locations of the errors; and
a program/erase block for the non-volatile memory, the program/erase block for performing a refresh operation of a stored location of the non-volatile memory to correct errors in the stored location of the non-volatile memory in response to the number of errors exceeding a limit, wherein the stored location is part of a block of the non-volatile memory, the program/erase block to determine that a number of errors in the block of the non-volatile memory exceeds a predetermined number of errors for the block of the non-volatile memory in response to a determination that the refresh operation did not correct the errors in the data, and to store the data in a different block of the non-volatile memory in response to determining that the number of errors in the block of the non-volatile memory exceeds the predetermined number of errors for the block of the non-volatile memory.

17. The system of claim 16, wherein the ECC block further comprises executing a different ECC on the information stored in the non-volatile memory if the refresh operation did not correct the errors.

18. The system of claim 17, wherein the information is stored in a different location of the non-volatile memory if after the different ECC is executed the number of errors exceeds the limit.

19. The system of claim 16, wherein the non-volatile memory is characterized as being a multi-level cell (MLC) flash memory.

20. The system of claim 16, wherein the system memory is characterized as being a multi-way associative cache.

* * * * *